(12) United States Patent
Fish et al.

(10) Patent No.: US 7,643,532 B2
(45) Date of Patent: Jan. 5, 2010

(54) MANUFACTURABLE SAMPLED GRATING MIRRORS

(75) Inventors: Gregory A. Fish, Santa Barbara, CA (US); Larry A. Coldren, Santa Barbara, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 541 days.

(21) Appl. No.: 11/180,347

(22) Filed: Jul. 13, 2005

(65) Prior Publication Data

US 2005/0265420 A1 Dec. 1, 2005

Related U.S. Application Data

(62) Division of application No. 09/879,821, filed on Jun. 11, 2001, now Pat. No. 6,937,638.

(60) Provisional application No. 60/210,612, filed on Jun. 9, 2000.

(51) Int. Cl.
*H01S 3/08* (2006.01)

(52) U.S. Cl. ............... 372/102; 372/43.01; 372/96; 372/99

(58) Field of Classification Search ............ 372/43.01, 372/50.11, 96, 98, 99, 102
See application file for complete search history.

(56) References Cited

U.S. PATENT DOCUMENTS

| | | | |
|---|---|---|---|
| 4,622,672 A | 11/1986 | Coldren et al. | |
| 4,896,325 A | 1/1990 | Coldren | |
| 5,088,097 A | 2/1992 | Ono et al. | |
| 5,325,392 A | 6/1994 | Tohmori et al. | |
| 5,379,318 A * | 1/1995 | Weber | 372/96 |
| 5,392,311 A * | 2/1995 | Makuta | 372/96 |
| 5,497,393 A * | 3/1996 | Lee | 372/96 |
| 5,579,328 A | 11/1996 | Habel et al. | |
| 5,715,271 A | 2/1998 | Huang et al. | |
| 5,790,581 A | 8/1998 | Nitta | |
| 5,841,799 A | 11/1998 | Hiroki | |
| 6,219,369 B1 | 4/2001 | Portnoi et al. | |
| 6,289,032 B1 | 9/2001 | Fay et al. | |
| 6,330,268 B1 | 12/2001 | Huang | |
| 6,345,135 B1 * | 2/2002 | Reid et al. | 385/37 |

(Continued)

FOREIGN PATENT DOCUMENTS

WO WO 99/40654 8/1999

OTHER PUBLICATIONS

Jayaraman et al, "Extended Tuning Range in Sampled Grating DBR Lasers", IEEE Phot. Tech. Lett., vol. 5, No. 5, May 1993, pp. 489-491 in view of Reid et al. (6,345,135).*

(Continued)

*Primary Examiner*—Minsun Harvey
*Assistant Examiner*—Xnning Niu
(74) *Attorney, Agent, or Firm*—Matthew A. Pequignot; Pequignot + Myers LLC

(57) ABSTRACT

The present invention relates to the tailoring the reflectivity spectrum of a sampled-grating distributed Bragg reflector (SGDBR) by applying digital sampling theory to choose the way each reflector is sampled. The resulting mirror covers a larger wavelength span and has peaks with a larger, more uniform, coupling constant ($\kappa$) than the mirrors produced using conventional approaches. The improved mirror also retains the benefits of the sample grating approach. Additionally, most of the embodiments are relatively simple to manufacture.

18 Claims, 7 Drawing Sheets

U.S. PATENT DOCUMENTS 6,826,206 B1 * 11/2004 Andersson .................. 372/20

OTHER PUBLICATIONS

I.A. Avrutsky et al., "Design of Widely Tunable Semiconductor Lasers and the Concept of Binary Superimposed Gratings (BSG's)," IEEE Journal of Quantum Elec., Apr. 1998, 34(4): 729-741.

L.A. Coldren et al., "Photonic Integrated Circuits," Diode Lasers and Photonic Integrated Circuits, John Wiley & Sons, 1995, ch. 8: 342-391.

L.A. Coldren et al., "Properties of Widely-Tunable Integrated WDM Sources and Receivers," 1997 Annual Meeting (LEOS), San Francisco, CA, USA, Nov. 1997, Paper No. TuY1, 331-332 [62-63].

L.A. Coldren et al., "Tunable Lasers for Photonic Integrated Circuits," IEEE Summer Topical on Integrated Optoelectronics, Lake Tahoe, NV, USA, Jul. 1994, Paper No. W4.1, 88-89.

L.A. Coldren, "Widely-Tunable and Vertical-Cavity Lasers: DBR's on Different Planes," Integrated Photonics Research, San Francisco, CA, USA, Feb. 1994, Paper No. ThA3-1, 75-76.

G. Fish et al., "Compact, 4 X 4 InGaAsP-InP Optical Crossconnect with a Scaleable Architecture," IEEE Photonics Tech. Lett., Sept. 1998, 10(9): 42-44.

G. Fish et al., "Improved Compositional Uniformity of InGaAsP Grown by MOCVD Through Modification of the Susceptor Temperature Profile," Journal of Crystal Growth, 1997, 32-38.

G. Fish et al., "InGaAsP/InP Scaleable, Photonic Crossconnects Using Optically Amplified Suppressed Modal Interference Switch Arrays," Integrated Photonics Research '98, Victoria, Canada, Mar. 1998, Paper No. ITuE4, 243-245 [39-41].

G. Fish et al., "InGaAsP/InP Suppressed Modal Interference Switches with Integrated Curved Amplifiers for Scaleable Photonic Crossconnects," Optical Fiber Conference '98, San Jose, CA, USA, Feb. 1998, Paper No. TuH4, 1pp.

G. Fish et al., "Suppressed Modal Interference Switches with Integrated Curved Amplifiers for Scaleable Photonic Crossconnects," IEEE Photonics Tech. Lett., Feb. 1998, 10(2)28-30.

M.E. Heimbuch et al., "Tertiarybutylarsine and Tertiarybutylphosphine for the MOCVD Growth of Low Threshold 1.55 μm $In_xGa_{1-x}As/InP$ Quantum-Well Lasers," Journal of Elec. Materials, 1994, 23(2): 77-81.

H. Ishii et al., "Broad-range Wavelength Coverage (62.4nm) with Superstructure-Grating DBR Laser," Elec. Lett., Feb. 29, 1996, 32(5): 454-455.

H. Ishii et al., "Quasicontinuous Wavelength Tuning in Super-Structure-Grating (SSG) DBR Lasers," IEEE Journal of Quantum Elec., Mar. 1996, 32(3): 433-441.

Y-H. Jan et al., "Widely Tunable Integrated Filter/Receiver with Apodized Grating-Assisted Codirectional Coupler (Invited)," SPIE Photonics West '98, San Jose, CA, USA, Jan. 1998, Paper No. 3290-232: 24-27.

V. Jayaraman et al., "Continuous-Wave Operation of Sampled Grating Tunable Lasers with 10 mwatt Output Power, >60 nm Tuning, and Monotonic Tuning Characteristics," Indium Phosphide Conference, Santa Barbara, CA, USA, Mar. 1994, 33-36 [82-85].

V. Jayaraman et al., "Demonstration of Broadband Tunability in a Semiconductor Laser Using Sampled Gratings," Appl. Phys. Lett., May 1992, 60(19): 110-112.

V. Jayaraman et al., "Extended Tuning Range in Sampled Grating DBR Lasers," IEEE Photonics Tech. Lett., May 1993, 5(5): 103-105.

V. Jayaraman et al., "Extended Tuning Range Semiconductor Lasers with Sampled Gratings," LEOS '91, San Jose, CA, USA, Nov. 1991, Paper No. SDL15.5: 82 [113].

V. Jayaraman et al., "Theory, Design, and Performance of Extended Tuning Range Semiconductor Lasers with Sampled Gratings," IEEE Journal of Quantum Elec., Jun. 1993, 29(6): 92-102.

V. Jayaraman et al., "Very Wide Tuning Range in a Sampled Grating DBR Laser," Int. Semiconductor Laser Conference, Takamatsu, Japan, Sep. 1992, 108-109.

V. Jayaraman, et al., "Wide Tunability and Large Mode-Suppression in a Multi-Section Semiconductor Laser Using Sampled Gratings," Integrated Photonics Research '92, New Orleans, LA, USA, Apr. 1992, Paper No. WF1, 306-307 [106-107].

V. Jayaraman et al., "Widely Tunable Continuous-Wave InGaAsP/InP Sampled Grating Lasers," Elec. Lett., Sep. 1994, 30(18): 90-91.

S-L. Lee et al., "Direct Modulation of Widely Tunable Sampled Grating DBR Lasers," SPIE, 1996, 2690(223): 223-230 [64-71].

S-L. Lee et al., "Dynamic Responses of Widely Tunable Sampled Grating DBR Lasers," Photonics Tech. Lett., Dec. 1996, 8(12): 72-74.

S-L. Lee et al., "Field-Induced Guide/Antiguide Modulators on InGaAsP/InP," Elec. Lett., Jun. 9, 1994, 30(12): 954-955 [86-87].

S-L. Lee et al., "Integration of Semiconductor Laser Amplifiers with Sampled Grating Tunable Lasers for WDM Applications," IEEE Journal of Selected Topics in Quantum Elec., Apr. 1997, 3(2): 49-61.

B. Mason et al., "Design of Sampled Grating DBR Lasers with Integrated Semiconductor Optical Amplifiers," IEEE Photonics Tech. Lett., Jul. 2000, 12(7): 1-3.

B. Mason et al., "Directly Modulated Sampled Grating DBR Lasers for Long-Haul WDM Communication Systems," IEEE Photonics Tech. Lett., 9(3): 46-48, Mar. 1997.

B. Mason et al., "Monolithic Integration of a Widely Tunable Laser and an Electro-Absorption Modulator," Integrated Photonics Research '99, Santa Barbara, CA, USA, Jul. 1999, Paper No. RME2, 53-55 [7-9].

B. Mason et al., "Ridge Waveguide Sampled Grating DBR Lasers with 22-nm Quasi-Continuous Tuning Range," IEEE Photonics Technology Letters, Sep. 1998, 10(9): 19-21.

B. Mason et al., "Sampled Grating DBR Lasers with 22nm Quasi-Continuous Tuning and Monolithically Integrated Wavelength Monitors," Intl. Semiconductor Laser Conf. '98, Nara, Japan, Oct. 1998, Paper No. ThC4, 22-23.

B. Mason et al., "Sampled Grating DBR Lasers with Integrated Wavelength Monitoring," Integrated Photonics Research '98, Victoria, Canada, Mar. 1998, Paper No. IMD5, 52-54 [13-15].

B. Mason et al., "Tunable Sampled-Grating DBR Lasers with Integrated Wavelength Monitors," IEEE Photonics Tech. Lett., Aug. 1998, 10(8): 16-18.

B. Mason et al., "Widely Tunable Lasers for Wavelength-Division Multiplexed Communications," Optical Fiber Communication '97, Dallas, TX, USA, Feb. 1997, 45.

B. Mason et al., "Widely Tunable Sampled Grating DBR Laser with Integrated Electroabsorption Modulator," IEEE Photonics Tech. Lett., Jun. 1999, 11(6): 4-6.

D.M. Tennant et al., "Multiwavelength Distributed Bragg Reflector Laser . . . Grating Mask," J. Vac. Sci. Technol. B, Nov./Dec. 1993, 11(6): 2509-2513.

H. Ishii et al., "Mode Stabilization Method for Superstructure-Grating DBR Lasers," Jnl. of Lightwave Technology, 1998,16(3): 433-442.

G. Sarlet et al., "Wavelength and Mode Stabilization of Widely Tunable SG-DBR and SSG-DBR Lasers," IEEE Photonics Tech. Lett., 1999,11(11): 1351-1353.

L.A. Coldren and S.W. Corzine, "Diode Lasers and Photonic Integrated Circuits," John Wiley & Sons, Inc., 1995, pp. 350-353.

* cited by examiner

MANUFACTURABLE SAMPLED GRATING MIRRORS

CROSS-REFERENCE TO RELATED APPLICATIONS

This application is a divisional application under 35 U.S.C. Section 121 of the following and commonly-assigned U.S. utility patent application: Ser. No. 09/879,821, filed Jun. 11, 2001, now U.S. Pat. No. 6,937,638 by Gregory A. Fish and Larry A. Coldren, entitled "IMPROVED, MANUFACTURABLE SAMPLED GRATING MIRRORS,"which application claims the benefit under 35 U.S.C. Section 119(e) of the following and commonly-assigned U.S. provisional patent application: Ser. No. 60/210,612, filed Jun. 9, 2000, by Gregory A. Fish and Larry A. Coldren, entitled "IMPROVED, MANUFACTURABLE SAMPLED GRATING MIRRORS, "both of which applications are incorporated by reference herein.

This application is related to the following and commonly-assigned U.S. utility patent applications:

Ser. No. 09/614,224, filed Jul. 12, 2000, by Larry A. Coldren et al., and entitled "METHOD OF MAKING A TUNABLE LASER SOURCE WITH INTEGRATED OPTICAL AMPLIFIER," now U.S. Pat. No. 6,654,400;

Ser. No. 09/614,377, filed Jul. 12, 2000, by Lay A. Coldren, and entitled "INTEGRATED OPTO-ELECTRONIC WAVELENGTH CONVERTER ASSEMBLY," now U.S. Pat. No. 6,580,739;

Ser. No. 09/614,376, filed Jul. 12, 2000, by Larry A. Coldren et al., and entitled "METHOD OF CONVERTING AN OPTICAL WAVELENGTH WITH AN OPTO-ELECTRONIC LASER WITH INTEGRATED MODULATOR," now U.S. Pat. No. 6,614,819;

Ser. No. 09/614,378, filed Jul. 12, 2000, by Larry A. Coldren et al., and entitled "OPTO-ELECTRONIC LASER WITH INTEGRATED MODULATOR," now U.S. Pat. No. 6,628,690;

Ser. No. 09/614,895, filed Jul. 12, 2000, by Larry A. Coldren, and entitled "METHOD FOR CONVERTING AN OPTICAL WAVELENGTH USING A MONOLITHIC WAVELENGTH CONVERTER ASSEMBLY," now U.S. Pat. No. 6,349,106;

Ser. No. 09/614,375, filed Jul. 12, 2000, by Larry A. Coldren et al., and entitled "TUNABLE LASER SOURCE WITH INTEGRATED OPTICAL AMPLIFIER," now U.S. Pat. No. 6,658,035;

Ser. No. 09/614,195, filed Jul. 12, 2000, by Larry A. Coldren et al., and entitled "METHOD OF MAKING AND OPTOELECTRONIC LASER WITH INTEGRATED MODULATOR," now U.S. Pat. No. 6,574,259;

Ser. No. 09/614,665, filed Jul. 12, 2000, by Larry A. Coldren et al., and entitled "METHOD OF GENERATING AN OPTICAL SIGNAL WITH A TUNABLE LASER SOURCE WITH INTEGRATED OPTICAL AMPLIFIER," now U.S. Pat. No. 6,687,278; and Ser. No. 09/614,674, filed Jul. 12, 2000, by Larry A. Coldren, and entitled "METHOD FOR MAKING A MONOLITHIC WAVELENGTH CONVERTER ASSEMBLY," now U.S. Pat. No. 6,624,000;

all of which are incorporated by reference herein, all of which claim priority to each other, and all of which claims the benefit under 35 U.S.C §119(e) to the following U.S. provisional patent applications:

Ser. No. 60/152,038, filed on Sep. 2, 1999, by Gregory Fish et al., and entitled "OPTOELECTRONIC LASER WITH INTEGRATED MODULATOR";

Ser. No. 60/152,049, filed on Sep. 2, 1999, by Larry Coldren, and entitled "INTEGRATED OPTOELECTRONIC WAVELENGTH CONVERTER"; and Ser. No. 60/152,072, filed on Sep. 2, 1999, by Beck Mason et al., and entitled "TUNABLE LASER SOURCE WITH INTEGRATED OPTICAL AMPLIFIER".

BACKGROUND OF THE INVENTION

1. Field of the Invention

The present invention relates generally to wide-range tunable semiconductor lasers and particularly to sampled-grating distributed Bragg reflector (SGDBR) lasers. More particularly, this invention relates to an improved design for sampled grating distributed Bragg reflector (DBR) mirrors.

2. Description of the Related Art

Diode lasers are being used in such applications as optical communications, sensors and computer systems. In such applications, it is very useful to employ lasers that can be easily adjusted to output frequencies across a wide wavelength range. A diode laser which can be operated at selectably variable frequencies covering a wide wavelength range, i.e. a widely tunable laser, is an invaluable tool. Such a "widely-tunable" laser enables real-time provisioning of bandwidth, and a much simplified sparing scheme. By including widely-tunable lasers in a system, if one laser malfunctions, a spare channel purposely left unused, may be configured to the wavelength of the malfunctioning laser and ensure the proper function of the system.

Thus, while diode lasers have provided solutions to many problems in communications, sensors and computer system designs, they have not fulfilled their potential based on the available bandwidth afforded by light-based systems. It is important that the number of channels be accessed and switched between in order for optical systems to be realized for many future applications.

For a variety of applications, it is necessary to have tunable single-frequency diode lasers which can be quickly configured to emit coherent light at any of a wide range of wavelengths. Such applications include sources and local oscillators in coherent lightwave communications systems, sources for other multi-channel lightwave communication systems, and sources for use in frequency modulated sensor systems. Continuous tunability is usually needed over some range of wavelengths. Continuous tuning is important for wavelength locking or stabilization with respect to some other reference, and it is desirable in certain frequency shift keying modulation schemes.

In addition, widely tunable semiconductor lasers, such as a sampled-grating distributed-Bragg-reflector (SGDBR) laser, a grating-coupled sampled-reflector (GCSR) laser, and vertical-cavity surface emitting lasers with micro-electromechanical moveable mirrors (VCSEL-MEMs) generally must compromise their output power in order to achieve a large tuning range. Designs that can provide over 40 nm of tuning range have not been able to provide much more than a couple of milliwatts of power out at the extrema of their tuning spectrum. However, current and future optical fiber communication systems as well as spectroscopic applications require output powers in excess of 10 mW over the full tuning band. Current ITU bands are about 40 nm wide near 1.55 µm and comprise the c-band, s-band and L-band, and it is desired to have a single component that can cover at least one or more of these bands.

Systems that are to operate at higher bit rates may require more than 20 mW over the full ITU bands. Such powers are available from DFB lasers, but these can only be tuned by a couple of nanometers by adjusting their temperature. Thus, it is very desirable to have a source with both wide tuning range (>40 nm) and high power (>10 mW) without a significant increase in fabrication complexity over existing widely tunable designs.

One path to achieving high output power and wide tuning ranges, is to improve upon the conventional sampled grating mirrors or reflectors (which shall be used interchangeably hereinbelow). FIG. 1 shows a typical reflectivity spectrum from a pair of mirrors used within a SG-DBR laser. The design of the SG-DBR is constrained by the desired tuning range, output power and side-mode suppression. It is impossible to simultaneously maximize all three of the above specifications using a SG-DBR, as improving one specification worsens the others. The major concerns when designing a multi-peaked mirror are to achieve the desired coupling constant ($\kappa$) and reflectivity (R) for each peak.

The sampled grating approach is limited largely by the fact that the unsampled grating $\kappa$ is technologically limited by optical scattering to around 300 cm$^{-1}$. Another limiting factor is that the reflectivity of the multi-peaked mirror falls off at the outer peaks, along with the gain. Therefore, it is desirable to increase the effective $\kappa$ of each peak as well as compensate for any loss in gain with increased reflectivity. In order to increase the $\kappa$ of the SG mirror peaks, the sampling duty ratio $L_B/\Lambda$ (the length of sampled portion $L_B$ divided by the sampling period $\Lambda$) must also increase. This duty ratio, however, is inversely proportional to the wavelength range the multi-peaked SG mirror can effectively cover, which limits the tuning range of a SG-DBR laser. See the mirror reflectivity peak envelope of FIG. 3b.

Therefore, what is needed in the art is a sampled grating mirror that covers a wide tuning range with the desired $\kappa$, as well as having mirror peaks that do not have substantial power dropoffs at the edges of the band.

SUMMARY OF THE INVENTION

To address the issues described hereinabove, enhanced sampled-grating distributed Bragg reflector (SGDBR) mirrors are disclosed and taught in accordance with the present invention. The major concerns when designing a SGDBR or multi-peaked mirror are to achieve the desired coupling constant ($\kappa$) and reflectivity (R) for each peak. The explicit details of the mirror design with respect to these values are described in U.S. Pat. No. 4,896,325, issued Jan. 23, 1990, to Larry A Coldren, entitled "MULTI-SECTION TUNABLE LASER WITH DIFFERING MULTI-ELEMENT MIRRORS", which patent is incorporated by reference herein.

Several references describe structures and methods for achieving wide tuning ranges. These references include:

V. Jayaraman, A. Mathur, L. A. Coldren and P. D. Dapkus, "Theory, Design, and Performance of Extended Tuning Range in Sampled Grating DBR Lasers," *IEEE J. Quantum Elec.*, v. 29, (no. 6), pp. 1824-1834, (June 1993);

H. Ishii, H. Tanobe, F. Kano, Y. Tohmori, Y. Kondo, Y. Yoshikuni, "Quasicontinuous Wavelength Tuning in Super-Structure-Grating (SSG) DBR Lasers", *IEEE J. Quantum Elec.*, v. 32, (no. 3), pp. 433-441, (March 1996);

I. Avrutsky, D. Ellis, A Tager, H. Anis, and J. Xu. "Design of Widely Tunable Semiconductor Lasers and the Concept of Binary Superimposed Gratings (BSG's)", *IEEE J. Quantum Elec.*, v. 34, (no. 4), pp. 729-741, (April 1998);

B. Mason, G. A. Fish, S. P. DenBaars, and L. A. Coldren, "Widely Tunable Sampled Grating DBR Laser with Integrated Electroabsorption Modulator," *Photon. Tech. Letts.*, 11, (6), 638-640, (June 1999); and Tennant, D. M., Koch, T. L., Verdiell, J.-M, Feder, K., Gnall, R. P., Koren, U., Young, A. G., Miller, B. I., Newkirk, M. A., Tell, B., *Journal of Vacuum Science & Technology B* vol. 11, (no. 6), November-December 1993. p. 2509-13.

Each of the proceeding references are incorporated herein by reference, however, they fail to teach or suggest the present invention.

The present invention comprises a specially configured DBR mirror. And such a mirror may be included in a tunable laser. The tunable laser generally comprises a gain section for creating a light beam by spontaneous emission over a bandwidth, a phase section for controlling the light beam around a center frequency of the bandwidth, a waveguide for guiding and reflecting the light beam in a cavity, a front mirror bounding an end of the cavity and a back mirror bounding an opposite end of the cavity wherein gain is provided by at least one of the group comprising the phase section, the front mirror and the back mirror.

This invention relates to the tailoring the reflectivity spectrum of a SGDBR by applying digital sampling theory to choose the way each mirror is sampled. The resulting mirror covers a larger wavelength span and has peaks with a larger, more uniform, coupling constant ($\kappa$) than the mirrors produced using conventional approaches. The improved mirror also retains the benefits of the sample grating approach. These embellishments on the SGDBR design provide devices that meet the higher power goals with wide tuning. In addition, most of the embodiments are relatively simple to manufacture.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and in which is shown, by way of illustration, an embodiment of the present invention. It is understood that other embodiments may be utilized and structural changes may be made without departing from the scope of the present invention.

Figure 1:
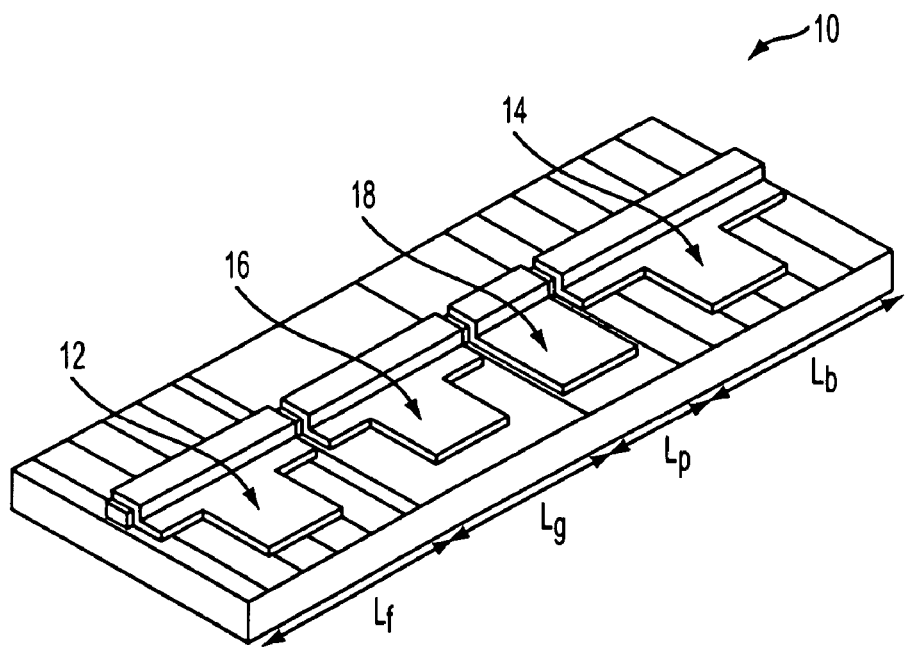
FIG. 1 Shows a schematic of a SG-DBR laser illustrating the use of two sampled grating reflectors to form the laser resonator containing a gain and phase shift region.
Figure 2:
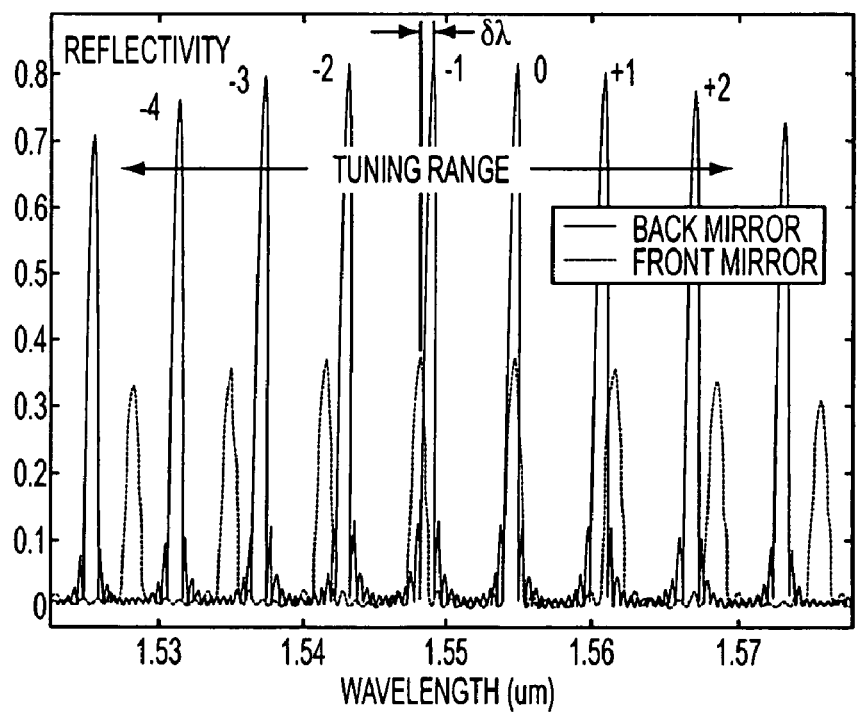
FIG. 2 illustrates the typical reflectivity spectrum of a sampled-grating mirror showing the multiple peaks and the decrease of the reflectivity at the edges of the spectrum.

FIG. 2 depicts a widely-tunable, four-section SG-DBR laser 10 that makes use of two multi-peaked DBR mirrors 12,14, which are formed and configured in accordance with the present invention, to achieve an extended tuning range. Currents are applied to the various electrodes to provide a desired output optical power and wavelength as discussed in U.S. Pat. No. 4,896,325. As described therein, a current to the gain section 16 creates light and provides gain to overcome losses in the laser cavity, currents to the two differing SG-DBR wavelength-selective mirrors 12,14 are used to tune a net low-loss window across a wide wavelength range to select a given mode; and a current to a phase section 18 provides for a fine tuning of the mode wavelength. It should also be understood that the sections 12,14,16,18 are somewhat interactive, so that currents to any will have some effect on the parameters primarily controlled by the others.

Figure 3A:
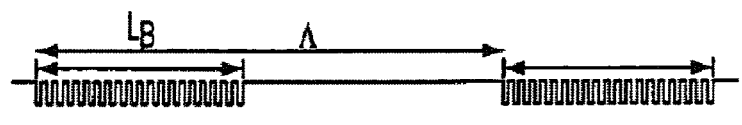
FIGS. 3 (a) & (b) illustrates a schematic diagram and the mathematical representation of the sampled grating reflector. The representation can be thought of the multiplication of grating function and a sampling function.
Figure 3B:
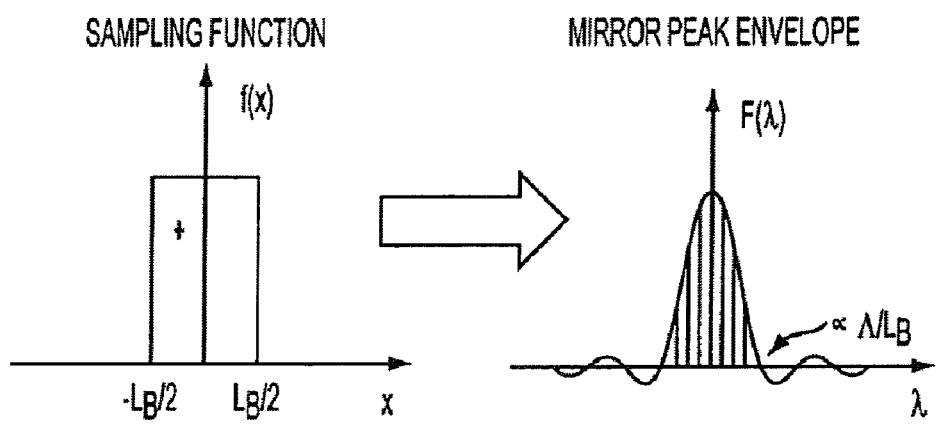

An example of the mirror spectra from a conventional pair of mirrors, without the improved configuration, is shown in FIG. 2. Mathematically, the sampled grating can be thought of as the multiplication of a grating function and a sampling function $f(x)$, as illustrated in FIGS. 3a and 3b. In the conventional design, the sampling function $f(x)$ can only have the value of +1 or 0, due to the technological method used in fabrication. The grating function is also technologically limited to $\kappa$'s less than 300 cm$^{-1}$, to prevent optical scattering.

Examining FIG. 3, the Fourier transform relation between the square sampling function $f(x)$ of the conventional SG mirror and its sinc sine function mirror peak envelope of reflectivity peaks is clearly obvious. A typical sampled grating includes a plurality of sampled grating portions separated from each other by portions with no grating. The sampled grating can be defined by the length $L_B$ of each sampled grating portion and the sampling period $\Lambda$. See FIG. 3a. Modification of the sampling function $f(x)$ to tailor the frequency response $F(\lambda)$ of the peak envelope is well known to those skilled in the art. In the case of the SG-DBR to be produced with a phase mask the sampling function $f(x)$ can only take the value of 0, 1 or −1, with −1 indicating a phase reversal of the grating function. Thus, sampling function value of −1 indicates a sampled grating portion having a phase opposite that of another sampled grating portion having a value of 1.

The phase mask technology for printing gratings, allows the sampling function to take on a value of +1, 0 and −1, with a manufacturable process that can be used to create sampled grating. Phase masking is well known to those skilled in the art, although this application is new. This invention relates to using this added degree of freedom offered by current phase masking technology to tailor the spectrum of the SG-DBR wavelength-selective mirrors to improve the laser performance.

Figure 4:
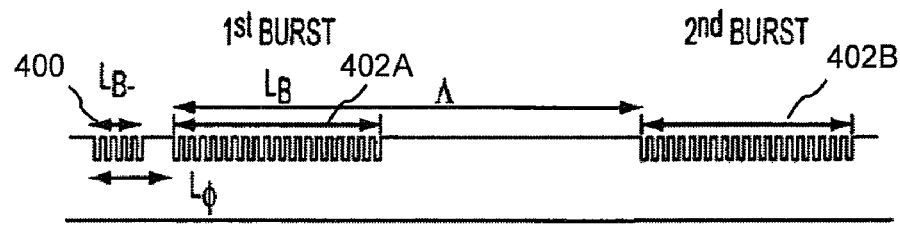
FIG. 4 gives an example of a very simple modification to the conventional grating that could be used to tailor the envelope of the peak mirror reflectivities, in which a burst of anti-phased grating is positioned properly in front of the 15$^{st}$ burst of the conventional grating.
Figure 5:
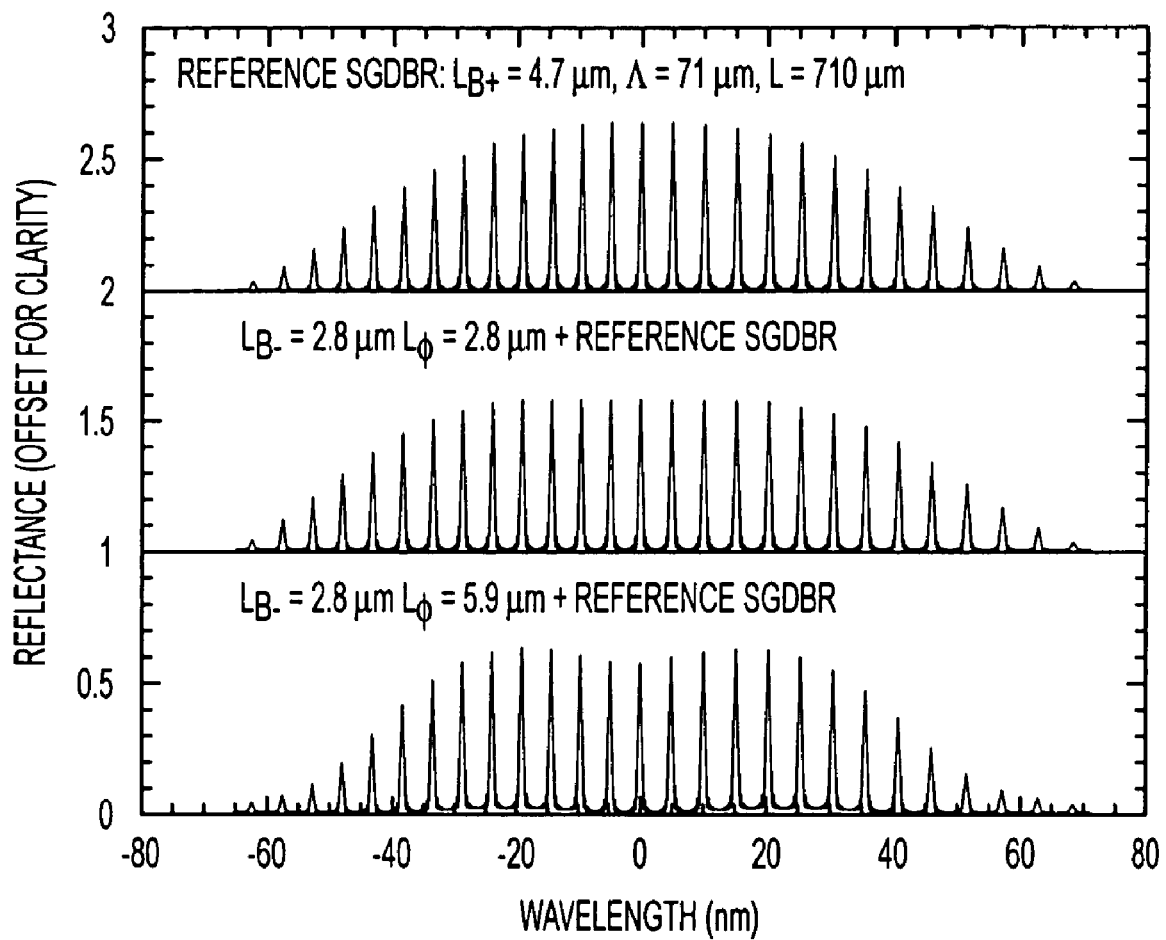
FIG. 5 shows a simulation illustrating the effect of the adding a single anti-phased burst to a conventional sampled grating DBR Proper positioning of the anti-phased burst can be used to flatten or modify the conventional spectra.

An embodiment of this invention can be as simple as adding a single anti-phased (i.e. having a phase opposite that of the sampled grating portions 402A, 402B) first grating burst portion 400 at the beginning of the first sampled grating portion 402A of a plurality of sampled grating portions 402A, 402B as shown in FIG. 4. The first grating burst portion 400 is defined by a length $L_{B-}$ and a distance $L_\phi$ from the first sampled grating portion 402A. Properly positioned, this first grating burst portion 400 can flatten the multi-peaked reflectivity spectrum or make the reflectivity larger at the edges, as shown in FIG. 5. These examples are very simple, and more sophisticated tailoring can be achieved identifying the analog sampling function that produces the desired effect and digitizing it using the strategies commonly employed in digital sampling applications.

Figure 6:
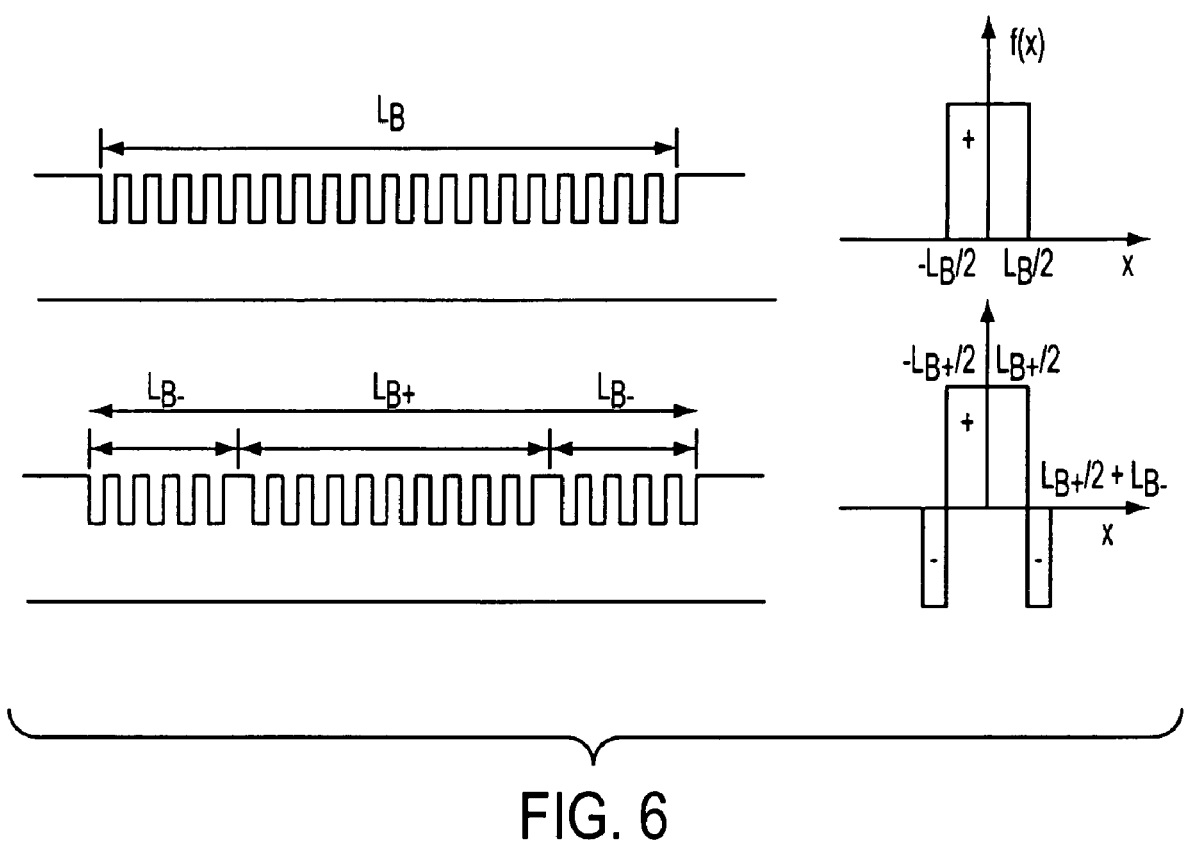
FIG. 6 illustrates a manipulation of the sampling function that leads to a more desirable multi-peaked sampled-grating reflector, by reversing the phase of the sampling function at the beginning and end of each burst.
Figure 7A:
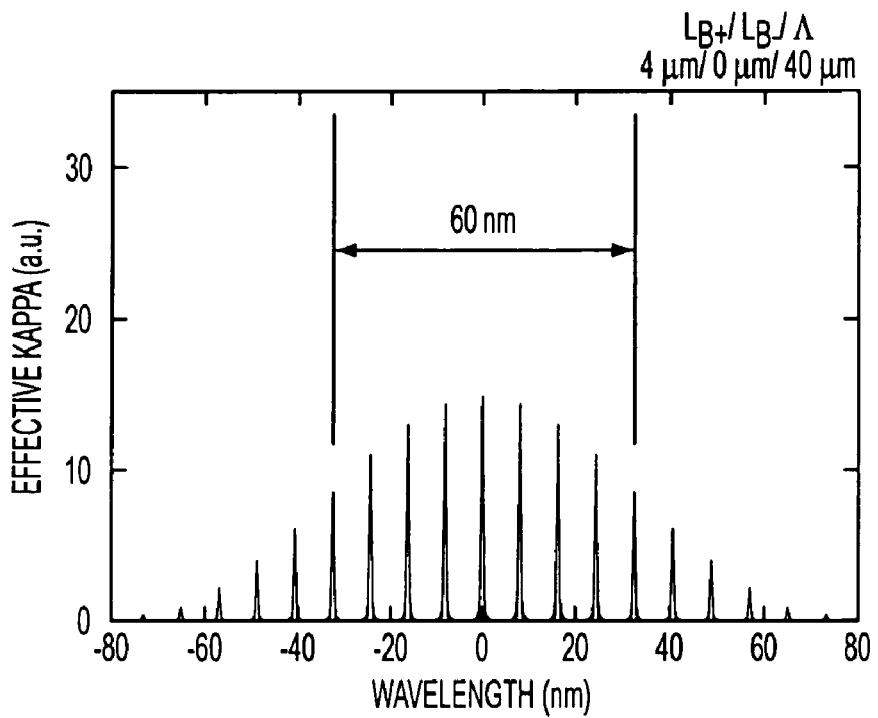
FIGS. 7 (a) & (b) illustrate an example of using the modified sampling function to give a wider wavelength range than the conventional sampling function.
Figure 7B:
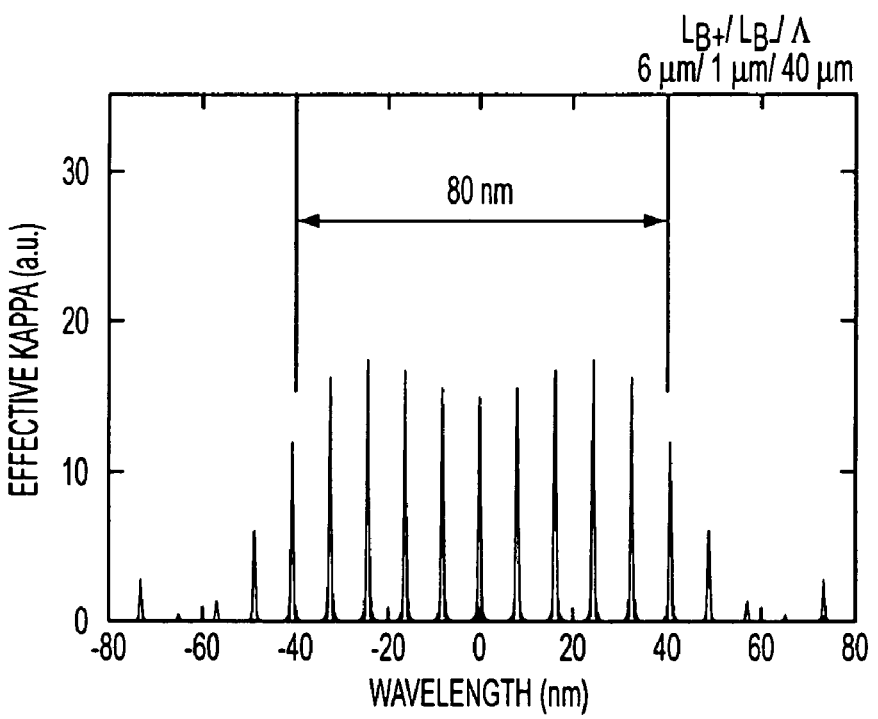

Another sampling function is shown in the lower half of FIG. 6. The entire sampled grating portion 600 has a first phase (associated with the $L_{B+}$ middle length 602) and a second phase (associated with the $L_{B-}$ end lengths 604A, 604B). Reversing the phase of the grating at the beginning and end of each sampled grating portion 600 can be used to tailor the peak envelope to allow for higher kappa over a larger range. FIGS. 7a and 7b illustrate an example of the peak envelopes that would result from the modification discussed in FIG. 6, showing that the modification produces the intended effect: a mirror with a wider wavelength range and with a larger throughout.

Figure 8A:
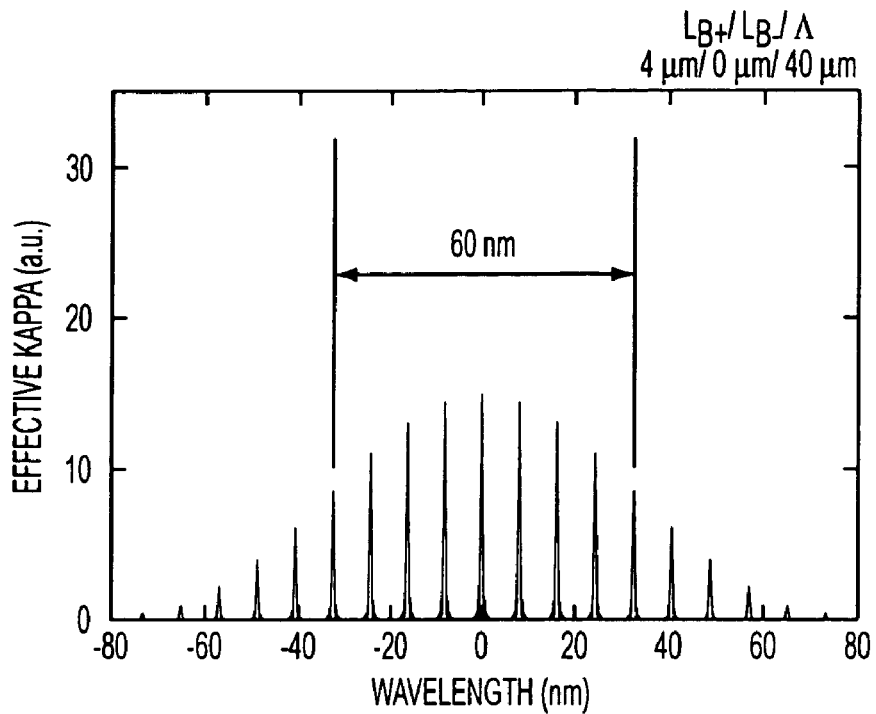
FIGS. 8 (a) & (b) illustrates an example of using the modified sampling function to give an increase in the $\kappa$ of the sampled grating mirror over the same wavelength range as the conventional sampling function.
Figure 8B:
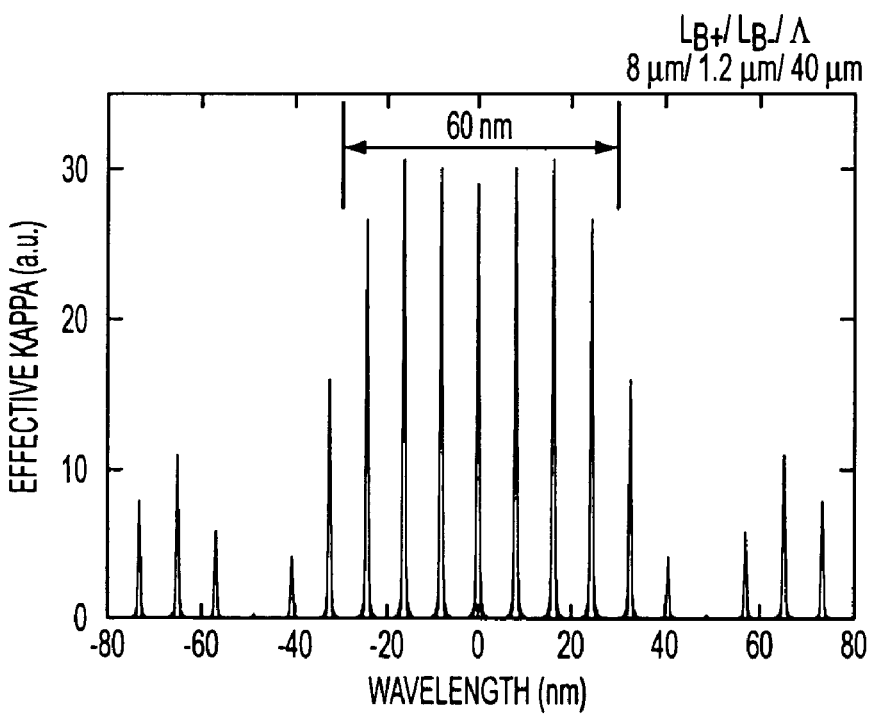
Figure 9:
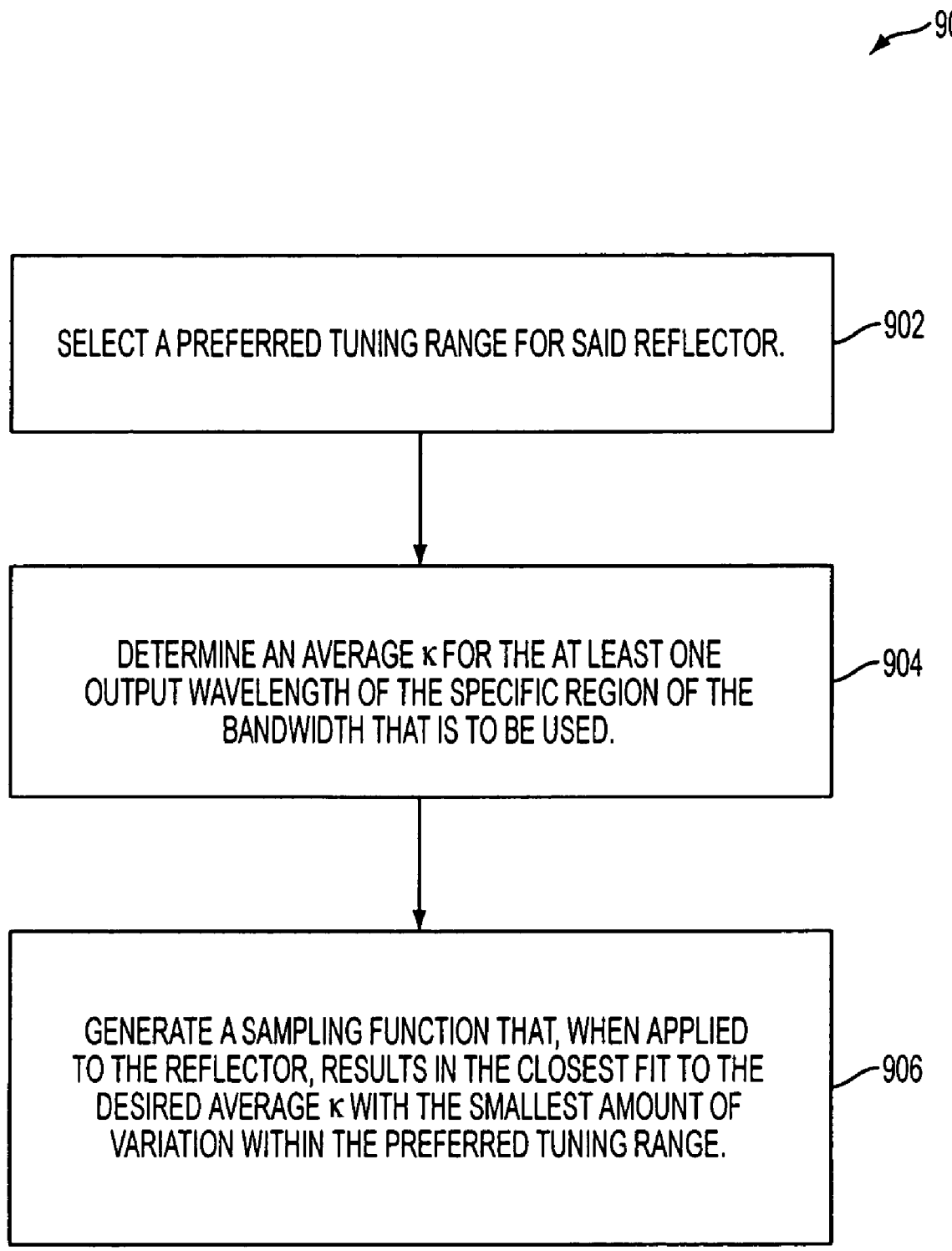
FIG. 9 illustrates the flow chart of the process for designing the sampled grating laser.

FIGS. 8a and 8b show a similar application of the sampling function that produces a mirror with twice the $\kappa$ over the same tuning range with a much flatter envelope. A more sophisticated and powerful embodiment is to use the phase mask capability to tailor the sampling function to achieve the desired mirror peak spectrum.

FIGS. 7 and 8 show specific modifications to the sampling function used to create sampled-grating mirrors that cover a larger wavelength range and have higher reflectivity than the conventional approach. However, those skilled in the art can manipulate the sampling function within the constraints of the phase mask technology to produce a wide range of desirable changes to the conventional approach. Additionally, as phase masking technology improves, the precision with which one may refine the sampling function will improve as well.

A method to select the configuration of a mirror 12,14 and therefore an associated sampling function, is to a) select a preferred $\kappa$ for the wavelengths of a specific region of the band(s) that are to be used, b) select a preferred tuning range, c) using a sampling function that, when applied to the laser's output, results in the closest fit to the desired $\kappa$ and output powers.

It is important to realize that one of the advantages of the sampled grating mirrors is that the areas without grating are technologically easier to produce with high tuning efficiency and reliability, as they have no etch damage and less exposed surface area. Therefore, it is desirable that the grating areas (regardless of its phase) occupy only a fraction of the entire mirror.

There are several advantages of this invention over the mirrors disclosed in the prior art. One of the biggest advantages is that the phase between the sampling function and the grating function need not be preserved, allowing the required phase mask to be fabricated with simply holography. In addition, all of the other methods accomplish the peak tailoring through the use of a modified grating that covers the entire surface of the waveguide, whereas this invention preserves the fact that the grating occupies less than 30% of the entire SG mirror. This is very important because it has a direct impact on the tuning efficiency of the mirror. During the fabrication of multi-peaked mirrors the process introduces crystal damage in the grating due to both etching and regrowth. This crystal damage reduces both tuning efficiency and lifetime of the widely tunable laser using these mirrors. It is much easier to produce a damage free surface in waveguide areas without grating, and SG-DBR's were shown to have superior tuning performance over other forms of widely tunable lasers with continuous gratings. Therefore, using the sampling function approach to modify the mirror spectrum is advantageous.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for configuring a sampled grating distributed Bragg reflector for use in a laser having an output within a specific wavelength band, the method comprising the steps of:
   (a) selecting a preferred κ for a plurality of wavelengths in the specific wavelength band that is to be used;
   (b) selecting a preferred wavelength tuning range for said reflector; and
   (c) generating a sampling function that, when applied to the reflector, results in a substantially close fit to the preferred κ within the preferred wavelength tuning range;
   wherein the sampling function produces a sampled grating including a plurality of sampled grating portions each having a first grating phase and a second grating phase, the sampled grating portions separated from each other by portions with no grating.

2. The method of claim 1, further comprising the step of sampling the reflector in accordance with the sampling function.

3. The method of claim 1, wherein the portions with no grating occupy more than 70% of the reflector.

4. A method for configuring a sampled grating distributed Bragg reflector for use in a laser having an output within a specific wavelength band, the method comprising the steps of:
   (a) selecting a preferred wavelength tuning range for said reflector:
   (b) determining a desired average κ for a plurality of wavelengths of the specific wavelength band that is to be used: and
   (c) generating a sampling function that, when applied to the reflector, results in a substantially close fit to the desired average κ within the preferred tuning range;
   wherein the sampling function produces a sampled grating including a plurality of sampled grating portions each having a first grating phase and a second grating phase, the sampled grating portions separated from each other by portions with no grating.

5. The method of claim 4, further comprising the step of sampling the reflector in accordance with the sampling function.

6. The method of claim 4, wherein the portions with no grating occupy more than 70% of the reflector.

7. A method for configuring a sampled grating distributed Bragg reflector for use in a laser having an output within a specific wavelength band, the method comprising the steps of:
   (a) selecting a preferred κ for a plurality of wavelengths within the specific wavelength band that is to be used;
   (b) selecting a preferred wavelength tuning range for said reflector;
   (c) generating a sampling function that produces a sampled grating including a plurality of sampled grating portions having a first grating phase separated from each other by portions with no grating; and
   (d) adding a first grating burst portion having a second grating phase different from the first grating phase at the beginning of a first sampled grating portion of the sampled grating;
   wherein the reflector results in a substantially close fit to the preferred κ within the preferred wavelength tuning range.

8. The method of claim 7, wherein the portions with no grating occupy more than 70% of the reflector.

9. The method of claim 7, wherein the second grating phase is substantially opposite that of said first grating phase of said sampled grating.

10. The method of claim 7, wherein the first grating burst portion is spaced apart from the first sampled grating portion by a spacing with no grating.

11. A method for configuring a sampled grating distributed Bragg reflector for use in a laser having an output within a specific wavelength band, the method comprising the steps of:
   (a) selecting a preferred wavelength tuning range for said reflector;
   (b) determining a desired average κ for a plurality of wavelengths of the specific wavelength band that is to be used;
   (c) generating a sampling function that produces a sampled grating including a plurality of sampled grating portions having a first grating phase separated from each other by portions with no grating; and
   (d) adding a first grating burst portion having a second grating phase different from the first grating phase at the beginning of a first sampled grating portion of the sampled grating;
   wherein the reflector results in a substantially close fit to the preferred κ within the preferred wavelength tuning range.

12. The method of claim 11, wherein the portions with no grating occupy more than 70% of the reflector.

13. The method of claim 11, wherein the first grating burst portion is spaced apart from the first sampled grating portion by a spacing with no grating.

14. The method of claim 11, wherein the first grating burst portion is spaced apart from the first sampled grating portion by a spacing with no grating and the second grating phase is substantially opposite that of said first grating phase of said sampled grating.

15. The method of claim 11, wherein the second grating phase is substantially opposite that of said first grating phase of said sampled grating.

16. The method of claim 1, wherein the sampling function reverses the grating phase at a beginning and an end of each sampled grating portion.

17. The method of claim 7, wherein the first grating burst portion is spaced apart from the first sampled grating portion by a spacing with no grating and the second grating phase is substantially opposite that of said first grating phase of said sampled grating.

18. The method of claim 4, wherein the sampling function reverses the grating phase at a beginning and an end of each sampled grating portion.

* * * * *